(12) United States Patent
Kim

(10) Patent No.: US 7,257,047 B2
(45) Date of Patent: Aug. 14, 2007

(54) PAGE BUFFER CIRCUIT OF FLASH MEMORY DEVICE WITH IMPROVED READ OPERATION FUNCTION AND METHOD OF CONTROLLING READ OPERATION THEREOF

(75) Inventor: Duck Ju Kim, Icheon-Si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 81 days.

(21) Appl. No.: 11/306,073

(22) Filed: Dec. 15, 2005

(65) Prior Publication Data

US 2006/0221739 A1    Oct. 5, 2006

(30) Foreign Application Priority Data

Mar. 30, 2005    (KR) .................... 10-2005-0026545

(51) Int. Cl.
    *G11C 8/00*    (2006.01)
(52) U.S. Cl. .............................. 365/230.04; 365/230.08
(58) Field of Classification Search .......... 365/230.04, 365/230.08, 185.12, 185.17
    See application file for complete search history.

(56) References Cited

U.S. PATENT DOCUMENTS 6,704,239 B2 * 3/2004 Cho et al. .............. 365/230.04
6,996,014 B2 * 2/2006 Lee et al. .............. 365/189.05
2003/0021172 A1 * 1/2003 Cho et al. .................... 365/203
2005/0226046 A1 * 10/2005 Lee et al. .............. 365/185.12

FOREIGN PATENT DOCUMENTS

| JP | 2005-063640 A | 3/2005 |
| KR | 2000-0059746 A | 10/2000 |
| KR | 10-2003-0072434 | 9/2003 |

* cited by examiner

Primary Examiner—Vu A. Le
(74) Attorney, Agent, or Firm—Marshall, Gerstein & Borun LLP

(57) ABSTRACT

A page buffer circuit of a flash memory device includes page buffers which are connected to the plurality of bit line pairs, respectively, and execute a read operation or a program operation on memory cells in response to bit line control signals, bit line select signals and control signals, and bit line precharge circuits, which are connected to the plurality of bit line pairs, respectively, and in the read operation, precharge one of a pair of bit lines connected thereto to a reference voltage level in response to bit line precharge signals. The reference voltage can be a stable voltage regardless of variation in temperature and/or voltage. A bit line precharge circuit supplies a stable precharge voltage to bit line regardless of variation in temperature and/or voltage in a read operation. Therefore, erroneous data can be prevented from being read.

17 Claims, 5 Drawing Sheets

PAGE BUFFER CIRCUIT OF FLASH MEMORY DEVICE WITH IMPROVED READ OPERATION FUNCTION AND METHOD OF CONTROLLING READ OPERATION THEREOF

TECHNICAL FIELD

This patent relates to flash memory devices, and more particularly, to a page buffer circuit of a flash memory device.

DISCUSSION OF RELATED ART

In general, a flash memory device includes a page buffer circuit that programs or reads a large capacity of data for a short period of time. Therefore, the program operation or the read operation of the flash memory device is performed by the page buffer circuit on a page basis.

FIG. 1 is a circuit diagram of a page buffer circuit and a Y-gate circuit of a flash memory device in the related art.

The page buffer circuit 11 includes a plurality of page buffers. The Y-gate circuit 12 includes a plurality of Y-gates. It is to be understood that only page buffers 20, 30 of the page buffer circuit 11 and Y-gates G1, G2 of the Y-gate circuit 12 are shown in FIG. 1 for simplicity. Each of the page buffers 20, 30 is connected to a pair of bit lines. In more detail, the page buffer 20 is connected between bit line BLe1, BLo1 and the Y-gate G1. The page buffer 30 is connected between bit lines BLe2, BLo2 and the Y-gate G2. The Y-gates G1, G2 are further connected to a data I/O line DIOL.

Furthermore, the page buffer 20 includes a bit line select circuit 21 and a register circuit 22. The bit line select circuit 21 includes NMOS transistors N21 to N24. The register circuit 22 includes a precharge circuit P21, a sensing circuit 23, a latch circuit 24, switches N25, N26, and a reset circuit N27. The sensing circuit 23 includes NMOS transistors N28, N29.

Furthermore, the page buffer 30 includes a bit line select circuit 31 and a register circuit 32 in the same manner as the page buffer 20. The bit line select circuit 31 includes NMOS transistors N31 to N34. The register circuit 32 includes a precharge circuit P31, a sensing circuit 33, a latch circuit 34, switches N35, N36, and a reset circuit N37. The sensing circuit 33 includes NMOS transistors N38, N39.

The read operation of the page buffer circuit 11 constructed above will be described based on the operation of the page buffer 20 with reference to FIG. 2.

Referring to FIG. 2, a precharge control signal (PRECHb) is enabled for a predetermined time (T1). As a result, the precharge circuit P21 precharges a sensing node S01 to a voltage (VCC) level in response to the precharge control signal (PRECHb). Furthermore, when the precharge control signal (PRECHb) is enabled, the bit line select signal (BSLe) is enabled a voltage (Vpre) level for a time (T2). At this time, the bit line select signal (BSLo) keeps disabled. The voltage (Vpre) is the same as the voltage (VCC) level.

The NMOS transistor N23 of the bit line select circuit 21 is turned on in response to the bit line select signal (BSLe) and connects the bit line BLe1 to the sensing node SO1. Consequently, the bit line BLe1 is precharged to a voltage (VCC-Vth, where Vth is the threshold voltage of the NMOS transistor N23) level by means of the voltage (VCC) of the sensing node SO1. At this time, the bit line BLe1 is precharged to a voltage (Vp1=VCC-Vth, where VCC, Vth is an ideal voltage level) level, as indicted by a dotted line "A" in FIG. 2.

However, if external environment such as temperature and voltage is changed, the voltage (Vpre) of the bit line select signal (BSLe) and the threshold voltage (Vth) of the NMOS transistor N23 can be changed. Therefore, the voltage of the bit line BLe1, which is precharged according to variation in temperature and/or voltage, can be changed.

For example, if the voltage (Vpre) decreases and the threshold voltage (Vth) rises, the NMOS transistor N23 is not sufficiently turned on by the voltage (Vpre). That is, as a turn-on resistance of the NMOS transistor N23 is increased, the NMOS transistor N23 does not sufficiently transfer the voltage (VCC) of the sensing node SO1 to the bit line BLe1. As a result, the bit line BLe1 is not sufficiently precharged and thus becomes a voltage (Vp2=Vp1-Vdiff) level, as indicated by a solid line "B" in FIG. 2.

If the bit line BLe1 is not sufficiently precharged as described above, the page buffer 20 may malfunction in a data sensing period (T3) that is subsequently performed. This will be described in more detail below. When the bit line select signal (BSLe) is enabled to a voltage (Vsen) level during a data sensing period (T3), the NMOS transistor N23 connects the bit line BLe1 to the sensing node SO1. Furthermore, if a bias voltage is applied to a word line connected to a memory cell to be read, the voltage of the bit line BLe1 is changed according to data stored in the memory cell.

For example, when data of the memory cell connected to the bit line BLe1 is '1', the bit line BLe1 is kept to a voltage level of a precharged state, i.e., the voltage (Vp2) level. As a result, in the period (T3), the voltage of the sensing node SO1, which is precharged to the voltage (VCC) higher than the voltage (Vp2), decreases. As a result, the sensing node SO1 becomes an intermediate level of a low level and a high level.

Thereafter, if a latch control signal (LCH) is enabled during a predetermined time (T4), the sensing circuit 23 that senses the voltage of the sensing node SO1 generates erroneously sensed data (SD). As described above, in the page buffer circuit 11, a precharge voltage of the bit line is changed according to variation in temperature and/or voltage in the read operation. Therefore, a problem arises because erroneous data are read.

Meanwhile, though not shown in FIG. 2, in the read operation, the bit line select circuits 21, 31 connect the bit lines BLe1, BLe2 to the sensing nodes SO1, SO2 at the same time in response to a bit line select signal (e.g., BSLe). As a result, data read from memory cells respectively connected to the bit lines BLe1, BLe2 are transferred to the sensing nodes SO1, SO2, respectively. At this time, voltages of the sensing nodes SO1, SO2 can be changed through mutual influence due to coupling capacitance (C) between the sensing nodes SO1, SO2.

As a result, a problem arises because erroneous read data may be transferred to the sensing nodes SO1, SO2. This problem may become more profound when the level of integration of flash memory devices is high and the number of bit line increases. That is, there is a problem in that as a distance between the sensing nodes becomes narrow, the voltages of the sensing nodes have a greater influence on the voltages of neighboring sensing nodes.

SUMMARY OF THE INVENTION

A page buffer of a flash memory device incorporates a stabilized precharge voltage to be applied to bit lines regardless of variation in temperature and/or voltage in the read operation, thus preventing erroneous data from being read.

A page buffer of a flash memory device further may utilize a method of controlling the read operation of a page buffer of a flash memory device which uses a stabilized precharge voltage applied to bit lines regardless of variation in temperature and/or voltage in the read operation, thus preventing erroneous data from being read.

The method further provides for controlling the read operation of a page buffer of a flash memory device, in which the read operations of first page buffers and second page buffers, which are alternately disposed one by one, are performed at different time points, thus reducing coupling capacitance components between neighboring sensing nodes and preventing erroneously data from being read.

A page buffer circuit of a flash memory device may include memory cells connected to a plurality of bit line pairs. The page buffer circuit includes page buffers which are connected to the plurality of bit line pairs, respectively, and execute a read operation or a program operation on memory cells in response to bit line control signals, bit line select signals and control signals, and bit line precharge circuits, which are connected to the plurality of bit line pairs, respectively, and in the read operation, precharge one of a pair of bit lines connected thereto to a reference voltage level in response to bit line precharge signals. The reference voltage is a stable voltage regardless of variation in temperature and/or voltage.

A page buffer circuit of a flash memory device may include first memory cells connected to first bit line pairs and second memory cells connected to second bit line pairs. The page buffer circuit includes first page buffers, which are connected to the first bit line pairs, respectively, and execute a read operation or a program operation on the first memory cells at the same time in response to first bit line control signals, first bit line select signals and first control signals; second page buffers, which are connected to the second bit line pairs, respectively, and execute a read operation or a program operation on the second memory cells at the same time in response to second bit line control signals, second bit line select signals and second control signals; first bit line precharge circuits, which are connected to the first bit line pairs, respectively, and precharge one of a pair of first bit lines connected thereto to a reference voltage level at the same time in response to first bit line precharge signals in the read operation of the first page buffers; and second bit line precharge circuits, which are connected to the second bit line pairs, respectively, and precharge one of a pair of second bit lines connected thereto to the reference voltage in response to second bit line precharge signals in the read operation of the second page buffers. The reference voltage is a stable voltage regardless of variation in temperature and/or voltage.

A method of controlling a read operation of a page buffer circuit may include allowing a precharge circuit of each of page buffers, each connected to a pair of bit lines, to precharge a sensing node to a set voltage in response to a precharge control signal; allowing each of bit line precharge circuits, each connected to a pair of bit lines, to precharge one of the pair of bit lines to a reference voltage level in response to bit line precharge signals; allowing a bit line select circuit of each of the page buffers to select one of the pair of bit lines and to connect the selected bit line to the sensing node, in response to bit line control signals and bit line select signals; and allowing a register circuit of each of the page buffers to sense a voltage of the sensing node, store the sensed data therein and output the stored data as read data, in response to a latch control signal. A bit line precharged to the reference voltage level is the selected bit line and the reference voltage is a stable voltage regardless of variation in temperature and/or voltage.

A method of controlling a read operation of a page buffer circuit may include allowing a first precharge circuit of each of first page buffers, each connected to a pair of first bit lines, to precharge a first sensing node to a set voltage in response to a first precharge control signal; allowing a second precharge circuit of each of second page buffers, each connected to a pair of second bit lines, to precharge a second sensing node to a set voltage in response to a second precharge control signal; allowing each of first bit line precharge circuits, each connected to the pair of first bit lines, to precharge one of the pair of first bit lines to a reference voltage level in response to first bit line precharge signals; allowing each of second bit line precharge circuits, each connected to the pair of second bit lines, to precharge one of the pair of second bit lines to a reference voltage level in response to second bit line precharge signals; allowing a first bit line select circuit of each of the first page buffers to select one of the pair of first bit lines and to connect the selected first bit line to the first sensing node, in response to first bit line control signals and first bit line select signals; allowing a second bit line select circuit of each of the second page buffers to select one of the pair of second bit lines and to connect the selected second bit line to the second sensing node, in response to second bit line control signals and second bit line select signals; allowing a first register circuit of each of the first page buffers to sense a voltage of the first sensing node, store first sensed data therein and output the stored data as first read data, in response to a first latch control signal; and allowing a second register circuit of each of the second page buffers to sense a voltage of the second sensing node, store second sensed data therein and output the stored data as second read data, in response to a second latch control signal. The first or second bit line that is precharged to the reference voltage level is the selected first or second bit line, and the reference voltage is a stable voltage regardless of variation in temperature and/or voltage.

A method of controlling a read operation of a page buffer circuit may include allowing a first bit line precharge circuit of each of first page buffers, each connected to a pair of first bit lines, to precharge one of the pair of first bit lines to a reference voltage level in response to first bit line precharge signals; allowing a second bit line precharge circuit of each of second page buffers, each connected to a pair of second bit lines, to precharge one of the pair of second bit lines to a reference voltage level in response to second bit line precharge signals; allowing a first precharge circuit of each of the first page buffers to precharge a first sensing node to a set voltage in response to a first precharge control signal; allowing a first bit line select circuit of each of the first page buffers to select one of the pair of first bit lines and to connect the selected first bit line to the first sensing node, in response to first bit line control signals and first bit line select signals; allowing a first register circuit of each of the first page buffers to sense a voltage of the first sensing node, stores first sensed data therein and output the stored data as first read data, in response to a first latch control signal, when the selected first bit line is connected to the first sensing node; allowing a second precharge circuit of each of the second page buffers to precharge a second sensing node to a set voltage in response to a second precharge control signal; allowing a second bit line select circuit of each of the second page buffers to select one of the pair of second bit lines and to connect the selected second bit line to the second sensing node, in response to second bit line control signals and second bit line select signals; and allowing a second register circuit of each of the second page buffers to sense a voltage of the second sensing node, stores second sensed data therein and output the stored data as second read data, in response to a second latch control signal, when the selected second bit line is connected to the second sensing node. The first page buffers and the second page buffers are alternately disposed one by one, and when the first bit line select circuit connects the selected first bit line to the first sensing node, the second bit line select circuit separates the selected second bit line from the second sensing node.

DETAILED DESCRIPTION

Figure 1:
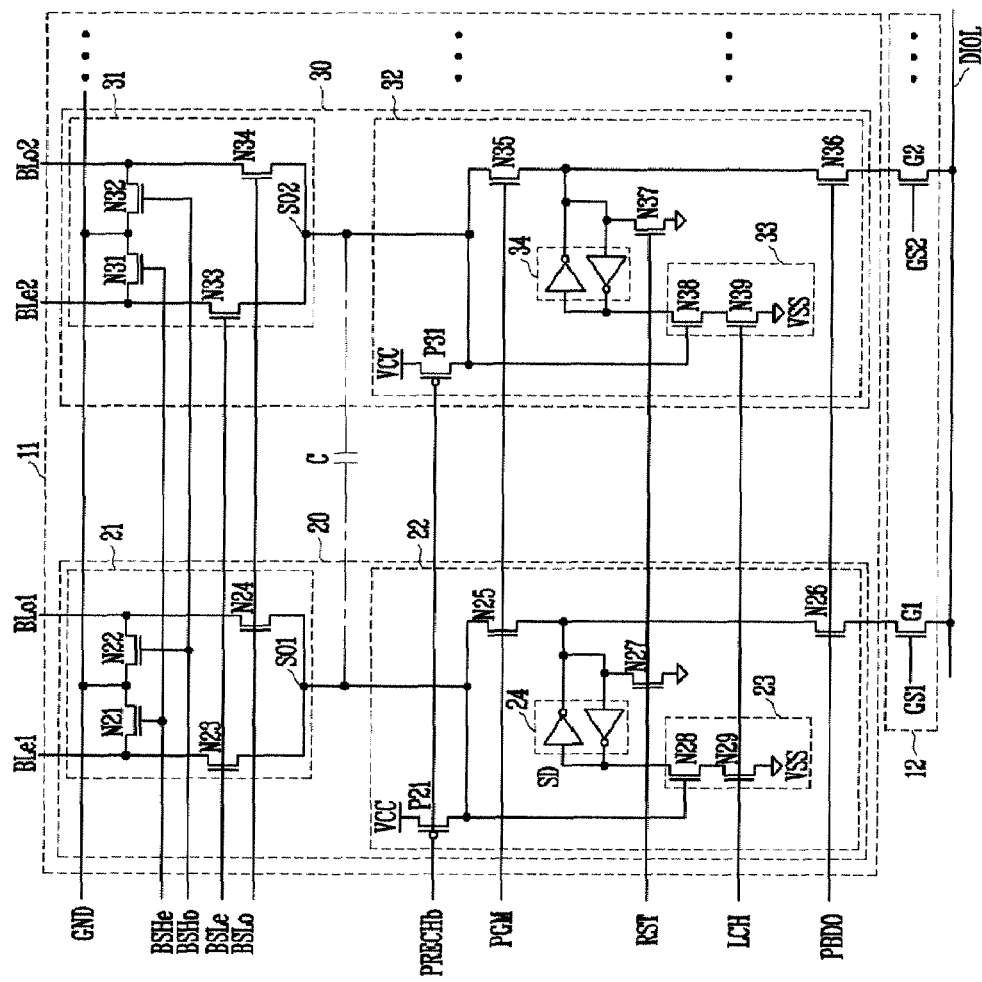
FIG. 1 is a circuit diagram of a page buffer circuit and a Y-gate circuit of a flash memory device in the related art.
Figure 2:
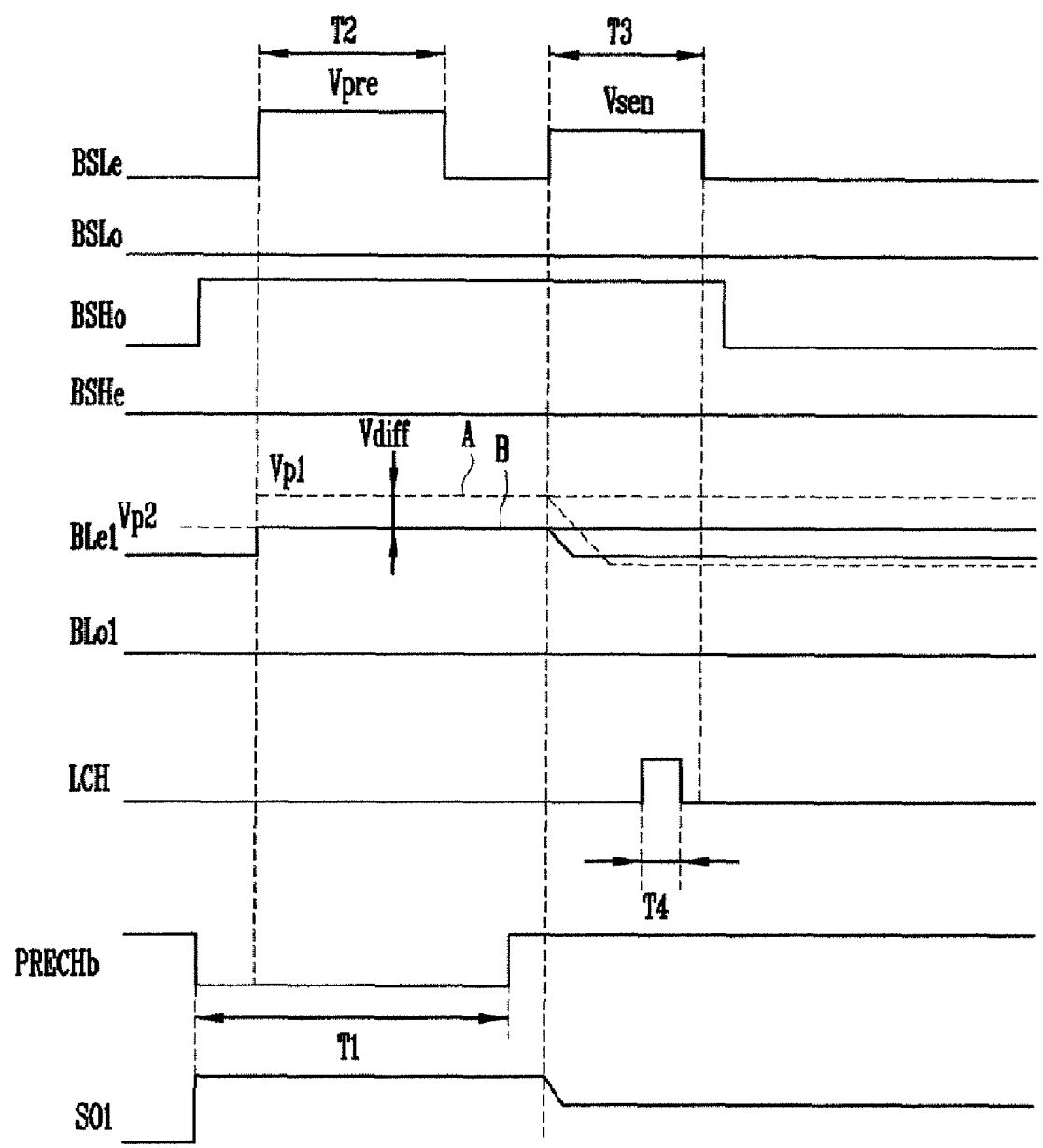
FIG. 2 is a timing diagram showing signals related to the read operation of the page buffer circuit shown in FIG. 1.
Figure 3:
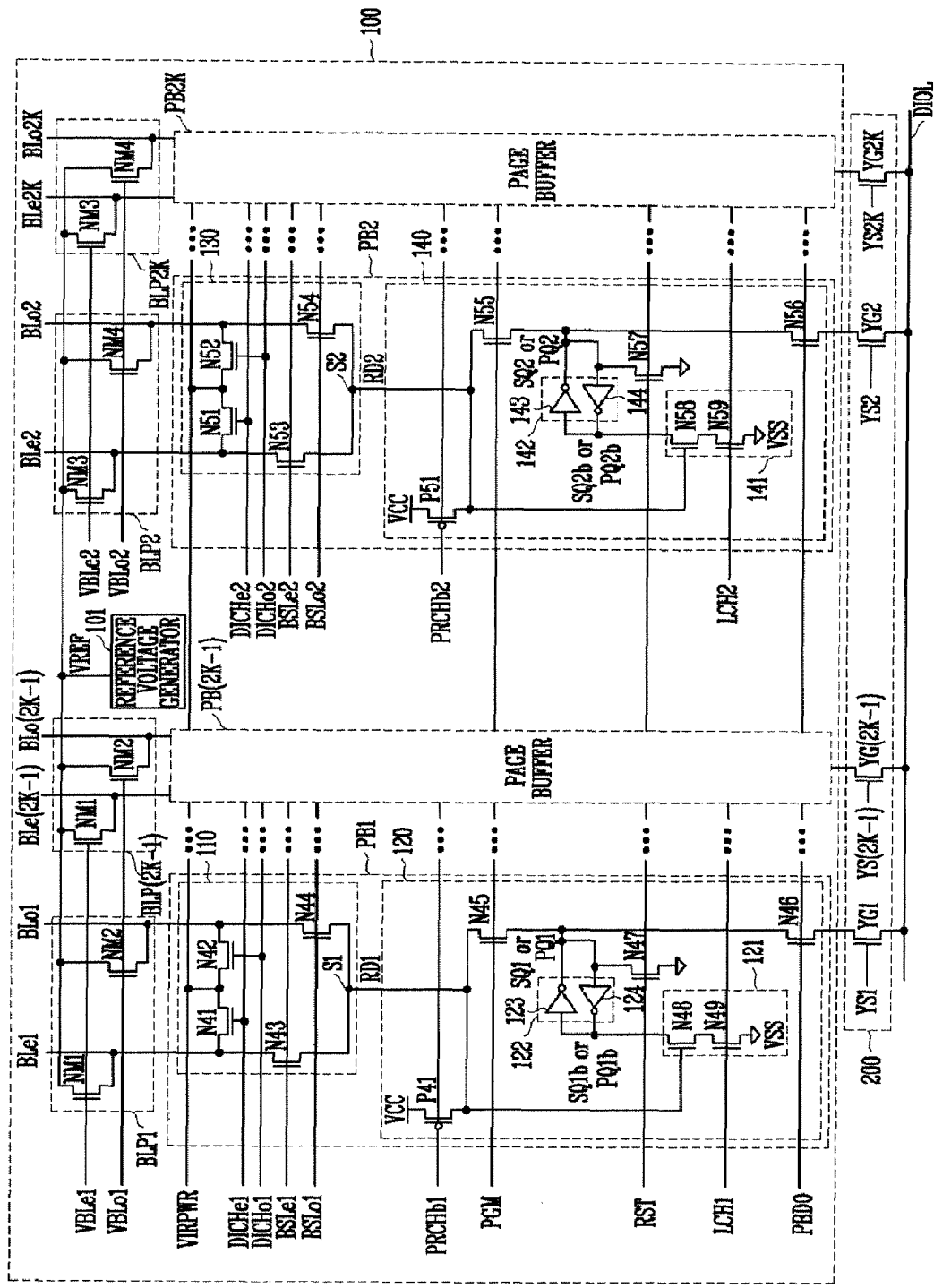
FIG. 3 is a circuit diagram of a page buffer circuit and a Y-gate circuit of a flash memory device according to a herein described embodiment.

FIG. 3 is a circuit diagram of a page buffer circuit and a Y-gate circuit of a flash memory device.

Referring to FIG. 3, a page buffer circuit 100 may be connected between bit lines BLe1 to BLo2K (K is an integer) and a Y-gate circuit 200. Although it has been shown in FIG. 3 that the bit lines BLe1, BLo1 to BLe(2K-1) and BLo(2K-1) are consecutively arranged and the bit lines BLe2, BLo2 to BLe2K and BLo2K are consecutively arranged, they can be arranged in pairs alternately. That is, they can be arrange in order of BLe1, BLo1, BLe2, BLo2, . . . , BLe(2K-1), BLo(2K-1), BLe2K and BLo2K. They may further take on any suitable arrangement.

The page buffer circuit 100 may include a reference voltage generator 101, a plurality of bit line precharge circuits BLP1 to BLP2K (K is an integer) and a plurality of page buffers PB1 to PB2K (K is an integer).

The reference voltage generator 101 generates a stabilized reference voltage (VREF) regardless of variation in temperature and/or voltage. The reference voltage (VREF) can be set to the same level as that of the voltage (VCC). Each of the bit line precharge circuits BLP1 to BLP2K and each of the page buffers PB1 to PB2K are connected one by one in each pair of bit lines. For example, the bit line precharge circuits BLP1 to BLP(2K-1) and the page buffers PB1 to PB(2K-1) are connected to the bit lines BLe1, BLo1 to BLe(2K-1) and BLo(2K-1), respectively. In more detail, the bit line precharge circuit BLP1 and the page buffer PB1 are connected to the bit lines BLe1, BLo1.

Each of the bit line precharge circuits BLP1 to BLP(2K-1) includes switches NM1, NM2. The switches NM1, NM2 can be implemented using a NMOS transistor. The construction and operation of the bit line precharge circuits BLP1 to BLP(2K-1) are substantially the same. Therefore, only the bit line precharge circuit BLP1 will be described as an example.

The switch NM1 of the bit line precharge circuit BLP1 is connected between a reference voltage (VREF) and the bit line BLe1 and is turned on or off in response to a bit line precharge signal (VBLe1). The switch NM1 is turned on to supply the reference voltage (VREF) to the bit line BLe1 so that the bit line BLe1 is precharged to the reference voltage (VREF).

The switch NM2 is connected between the reference voltage (VREF) and the bit line BLo1 and is turned on or off in response to a bit line precharge signal (VBLo1). The switch NM2 is turned on to supply the reference voltage (VREF) to the bit line BLo1 so that the bit line BLo1 is precharged to the reference voltage (VREF) level.

Each of the page buffers PB1 to PB(2K-1) may include a bit line select circuit 110 and a register circuit 120. The construction and operation of the page buffers PB1 to PB(2K-1) are substantially the same. Therefore, only the page buffer PB1 will be described as an example.

The bit line select circuit 110 of the page buffer PB1 includes NMOS transistors N41 to N44. The NMOS transistor N41 is connected between the bit line BLe1 and a bit line bias voltage (VIRPWR) and is turned on or off in response to a bit line control signal (DlCHe1). The NMOS transistor 41 is turned on to apply the bit line bias voltage (VIRPWR) to the bit line BLe1. The bit line bias voltage (VIRPWR) is set to a ground voltage (VSS) in the read operation.

The NMOS transistor N42 is connected between the bit line BLo1 and the bit line bias voltage (VIRPWR) and is turned on or off in response to a bit line control signal (DlCHo1). Then NMOS transistor N42 is turned on to supply the bit line bias voltage (VIRPWR) to the bit line BLo1.

The NMOS transistor N43 is connected between the bit line BLe1 and a sensing node S1 and is turned on or off in response to a bit line select signal (BSLe1). The NMOS transistor N43 is turned on to connect the bit line BLe1 to the sensing node S1.

The NMOS transistor N44 is connected between the bit line BLo1 and the sensing node S1 and is turned on or off in response to a bit line select signal (BSLo1). The NMOS transistor 44 is turned on to connect the bit line BLo1 to the sensing node S1.

The register circuit 120 of the page buffer PB1 includes a precharge circuit P41, a sensing circuit 121, a latch circuit 122, pass circuits N45, N46, and a latch reset circuit N47.

The precharge circuit P41 precharges the sensing node S1 to the voltage (VCC) level in response to a precharge control signal (PRCHb1). The sensing circuit 121 senses a voltage of the sensing node S1, which is decided by read data (RD1) from one of the bit lines BLe1, BLo1, in response to a latch control signal (LCH1) in the read operation, and generates sensed data (SQ1b). The latch circuit 122 includes inverters 123, 124 and latches the sensed data (SQ1b) in the read operation and latches program data (PQ1) in the program operation.

The pass circuits N45, N46 can be implemented using an NMOS transistor. The pass circuit N45 is connected between the latch circuit 122 and the sensing node S1 and outputs the program data (PQ1), which are received from the latch circuit 122, to the sensing node S1 in response to a program control signal (PGM) in the program operation.

The pass circuit N46 is connected between the latch circuit 122 and the Y-gate YG1 of the Y-gate circuit 200. The pass circuit N46 is turned on or off in response to an I/O control signal (PBDO). The pass circuit N46 outputs inverted data (SQ1) of the sensed data (SQ1b), which are received from the latch circuit 122, to the Y-gate YG1 in response to the I/O control signal (PBDO) in the read operation. The pass circuit N46 also outputs the program data (PQ1), which are received from the Y-gate YG1, to the latch circuit 122 in response to the I/O control signal (PBDO) in the program operation.

The latch reset circuit N47 initializes the latch circuit 122 in response to a reset control signal (RST).

Furthermore, the bit line precharge circuits BLP2 to BLP2K and the page buffers PB2 to PB2K are connected to the bit lines BLe2, BLo2 to BLe2K, BLo2K, respectively. In more detail, the bit line precharge circuit BLP2 and the page buffer PB2 are connected to the bit lines BLe2, BLo2. Each of the bit line precharge circuits BLP2 to BLP2K includes switches NM3, NM4. The switches NM3, NM4 can be implemented using a NMOS transistor. The construction and operation of the bit line precharge circuits BLP2 to BLP2K are substantially the same. Therefore, only the bit line precharge circuit BLP2 will be described as an example will be described as an example.

The switch NM3 of the bit line precharge circuit BLP2 is connected between the reference voltage (VREF) and the bit line BLe2 and is turned on or off in response to a bit line precharge signal (VBLe2). The switch NM3 is turned on to supply the reference voltage (VREF) to the bit line BLe2, so that the bit line BLe2 is precharged to the reference voltage (VREF) level.

The switch NM4 is connected between the reference voltage (VREF) and the bit line BLo2 and is turned on or off in response to a bit line precharge signal (VBLo2). The switch NM4 is turned on to supply the bit line BLo2 with the reference voltage (VREF), so that the bit line BLo2 is precharged to the reference voltage (VREF) level.

Each of the page buffers PB2 to PB2K may include a bit line select circuit 130 and a register circuit 140. The construction and operation of the page buffers PB2 to PB2K are substantially the same. Therefore, only the page buffer PB2 will be described as an example.

The bit line select circuit 120 of the page buffer PB2 may include NMOS transistors N51 to N54. The construction and operation of the bit line select circuit 120 are substantially the same as those of the bit line select circuit 110. Therefore, the construction and operation of the bit line select circuit 120 will not be described in order to avoid redundancy. The bit line select circuits 110, 120 are different from each other in that the bit line select circuit 120 operates in response to the bit line control signals (DlCHe2, DlCHo2) and the bit line select signals (BSLe2, BSLo2)

The register circuit 140 of the page buffer PB2 may include a precharge circuit P51, a sensing circuit 141, a latch circuit 142, pass circuits N55, N56, and a latch reset circuit N57. The construction and operation of the register circuit 140 is substantially the same as those of the register circuit 120. Therefore, the construction and operation of the register circuit 140 will not be described in order to avoid redundancy. The register circuits 120, 140 differ from each other in that the register circuit 140 are operated in response to a precharge control signal (PRCHb2) and a latch control signal (LCH2). Meanwhile, the pass circuits N46, N56 of the page buffers PB1 to PB2K are connected to the Y-gates YG1 to YG2K of the Y-gate circuit 200, respectively. Furthermore, the Y-gates YG1 to YG2K are connected to data I/O lines DIOL.

Meanwhile, when the bit lines BLe1, BLo1 to BLe2K, BLo2K are arranged in order of BLe1, BLo1, BLe2, BLo2, ..., BLe(2K−1), BLo(2K−1), BLe2K and BLo2K, as described above, the page buffers PB1 to PB2K can be arranged in order of PB1, PB2, ..., PBK and PB2K.

Figure 4:
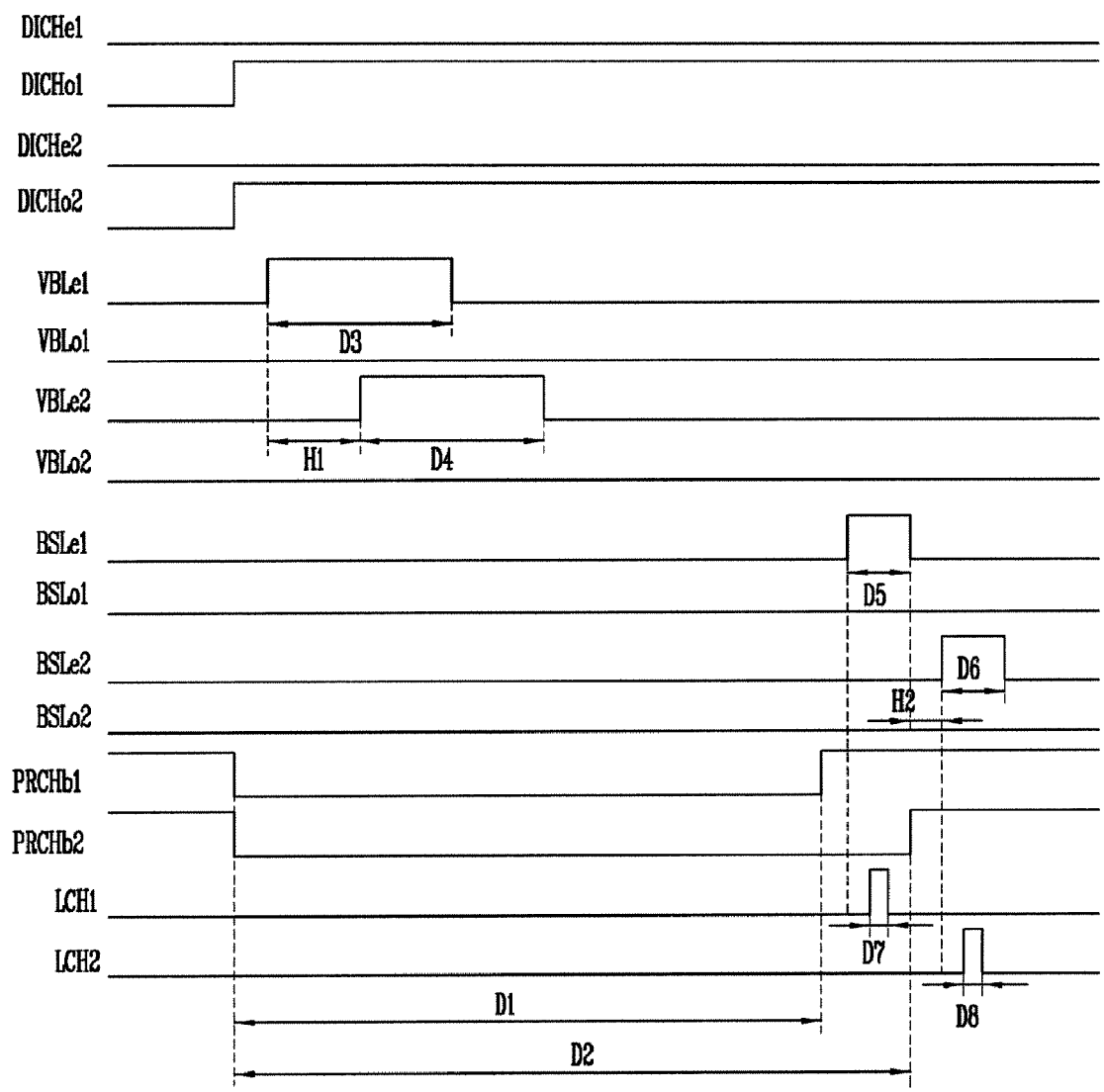
FIGS. 4 and 5 are timing diagrams showing signals related to the read operation of the page buffer circuit shown in FIG. 3.

An embodiment of the read operation of the page buffer circuit 100 will be described in detail with reference to FIG. 4. FIG. 4 shows an exemplary timing diagram of related signals in the case where data of memory cells connected to the bit lines BLe1 to BLe2K are read.

The bit line control signals (DlCHo1, DlCHo2) are enabled and the bit line control signals (DlCHe1, DlCHe2) are disabled. The bit line select circuits 110 of the page buffers PB1,PB3, ...,PB(2K−1) supply the bit lines BLo1, BLo3, ..., BLo(2K−1) with the bit line bias voltage (VIRPWR) in response to the bit line control signal (lDlCHo1). In the read operation, the bit line bias voltage (VIRPWR) is set to the ground voltage (VSS) level. As a result, the bit lines BLo1, BLo3, ..., BLo(2K−1) are discharged to the ground voltage (VSS) level.

Furthermore, the bit line select circuits 130 of the page buffers PB2,PB4, ...,PB2K supply the bit lines BLo2, BLo4,..., BLo2K with the bit line bias voltage (VIRPWR) in response to the bit line control signal (DlCHo2). As a result, the bit lines BLo2, BLo4,..., BLo2K are discharged to the ground voltage (VSS) level. At this time, the bit line select circuits 110, 130 of the page buffers PB1 to PB2K do not supply the bit line bias voltage (VIRPWR) to the bit lines BLe1 to BLe2K in response to the bit line control signals (DlCHe1, DlCHe2).

Meanwhile, the precharge control signal (PRCHb1) is disabled for a predetermined time (D1) and the precharge control signal (PRCHb2) is disabled for a predetermined time (D2). As a result, the precharge circuits P41 of the page buffers PB1,PB3, ...,PB(2K−1) precharge the sensing nodes S1 to the voltage (VCC) level in response to the precharge control signal (PRCHb1). Furthermore, the precharge circuits P51 of the page buffers PB2,PB4,...,PB2K precharge the sensing nodes S2 to the voltage (VCC) level in response to the precharge control signal (PRCHb2). The precharge control signals (PRCHb1, PRCHb2) can be disabled at the same time, and the predetermined time (D2) can be set to be longer than the predetermined time (D1).

When the precharge control signal (PRCHb1) is disabled, the bit line precharge signal (VBLe1) is enabled during a predetermined time (D3). At this time, the bit line precharge signal (VBLo1) keeps disabled. As a result, the bit line precharge circuits BLP1, BLP3, ..., BLP(2K−1) precharge the bit lines BLe1), BLe3, ..., BLe(2K−1) to the reference voltage (VREF) level in response to the bit line precharge signal (VBLe1). The reference voltage (VREF) is kept to a constant voltage (e.g., VCC) level regardless of variation in temperature and/or voltage.

Furthermore, the bit line precharge signal (VBLe2) is enabled during a predetermined time (D4) after a predetermined time (H1) elapses since the bit line precharge signal (VBLe1) is enabled. As a result, the bit line precharge circuits BLP2, BLP4, ...,PLP2K precharge the bit lines BLe2, BLe4, ..., BLe2K to the reference voltage (VREF) level in response to the bit line precharge signal (VBLe2).

After the predetermined time (D1) elapses, the bit line select signal (BSLe1) is enabled during a predetermined time (D5). When the bit line select signal (BSLe1) is enabled, the latch control signal (LCH1) is enabled during a predetermined time (D7). At this time, the bit line select signal (BSLo1) keeps disabled. As a result, the bit line select circuits 110 of the page buffers PB1, PB3, ..., PB(2K−1) connect the bit lines BLe1, BLe3, ..., BLe(2K−1) to the sensing nodes S1, respectively, in response to the bit line select signal (BSLe1).

In this case, the bit lines BLe1, BLe3, ..., BLe(2K−1) are precharged to a stable reference voltage (VREF) level regardless of variation in temperature and/or voltage. Therefore, a voltage of each of the sensing nodes S1 can become high level or low level accurately according to a value of the read data (RD1) of memory cells (not shown) connected to the bit lines BLe1, BLe3, ..., BLe(2K−1). Therefore, each of the sensing circuits 121 of the page buffers PB1, PB3, . . . ,PB(2K−1) erroneously operates, but senses a voltage of the sensing node S1 and generates the sensed data (SQ1b), in response to the latch control signal (LCH1).

Thereafter, each of the latch circuits 122 of the page buffers PB1,PB3, . . . ,PB(2K−1) latches the sensed data (SQ1b) and outputs the inverted sensed data (SQ1).

Meanwhile, the bit line select signal (BSLe2) is enabled during a predetermined time (D6) after a predetermined time (H2) elapses since the bit line select signal (BSLe1) is enabled. When the bit line select signal (BSLe2) is enabled, the latch control signal (LCH2) is enabled during a predetermined time (D8). At this time, the bit line select signal (BSLo2) keeps disabled. As a result, the bit line select circuits 130 of the page buffers PB2,PB4, . . . ,PB2Kc connect the bit lines BLe2, BLe4, . . . , BLe2K to the sensing nodes S2, respectively, in response to the bit line select signal (BSLe2).

In this case, the bit lines BLe2, BLe4, . . . , BLe2K are precharged to a stable reference voltage (VREF) level regardless of variation in temperature and/or voltage. Therefore, a voltage of the sensing nodes S2 can become high level or low level accurately according to a voltage of the read data (RD2) of memory cells (not shown) connected to the bit lines BLe2, BLe4, . . . , BLe2K. Therefore, each of the sensing circuits 141 of the page buffers PB2,PB4, . . . ,PB2K erroneously operates, but senses a voltage of the sensing node S2 in response to the latch control signal (LCH2) and generates the sensed data (SQ2b).

Thereafter, each of the latch circuits 142 of the page buffers PB2,PB4, . . . ,PB2K latches the sensed data (SQ1b) and outputs the inverted sensed data (SQ2).

Though not shown in FIG. 4, thereafter, if the I/O control signal (PBDO) is enabled, the pass circuits N46, N56 of the page buffers PB1 to PB2K output the inverted sensed data (SQ1, SQ2), which are received from the latch circuits 122, 142, to the Y-gates YG1 to YG2K of the Y-gate circuit 200 at the same time in response to the I/O control signal (PBDO). Thereafter, the gate control signals (YS1 to YS2K) are sequentially enabled one by one for a predetermined time and then disabled. That is, when one of the gate control signals (YS1 to YS2K) is enabled, the remaining gate control signals are disabled. Furthermore, YS1, YS2, YS3, . . . , YS 2K−1, YS2K can be consecutively enabled one by one in that order. As a result, the Y-gates YG1 to YG2K sequentially output the sensed data (SQ1, SQ2) to the data I/O lines DIOL, respectively.

Figure 5:
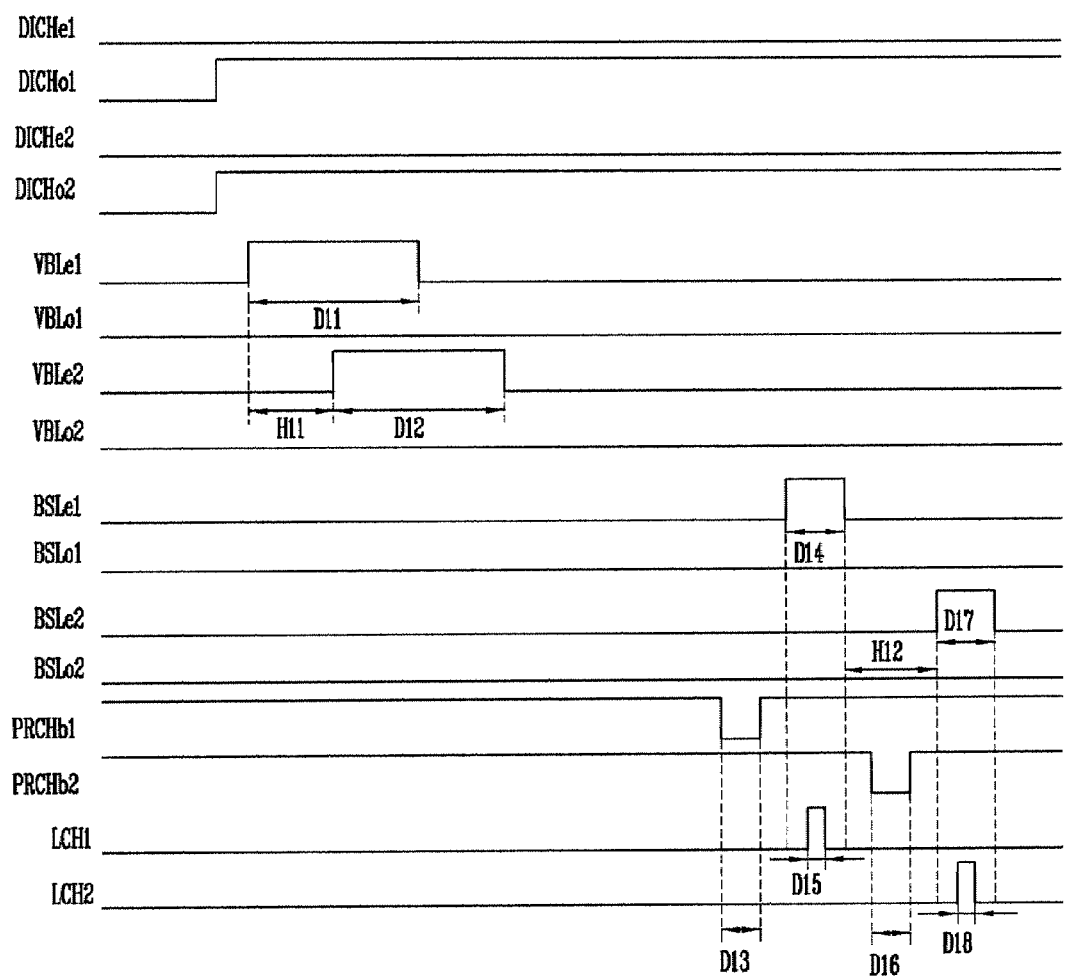

Another embodiment of the read operation of the page buffer circuit 100 will be described in detail below with reference to FIG. 5. FIG. 5 shows an exemplary timing diagram of related signals in the case where data of memory cells connected to the bit lines BLe1 to BLe2K are read.

The bit line control signals (DlCHo1, DlCHo2) are enabled and the bit line control signals (DlCHe1, DlCHe2) are disabled. The bit line select circuits 110 of the page buffers PB1,PB3, . . . ,PB(2K−1) supply the bit lines BLo1, BLo3, . . . , BLo(2K−1) with the bit line bias voltage (VIRPWR) in response to the bit line control signal (lDlCHo1). In the read operation, the bit line bias voltage (VIRPWR) is set to the ground voltage (VSS) level. As a result, the bit lines BLo1, BLo3, . . . , BLo(2K−1) are discharged to the ground voltage (VSS) level.

Furthermore, the bit line select circuits 130 of the page buffers PB2,PB4, . . . ,PB2K supply the bit lines BLo2, BLo4, . . . ,BLo2K with the bit line bias voltage (VIRPWR) in response to the bit line control signal (DlCHo2). As a result, the bit lines BLo2, BLo4, . . . , BLo2K are discharged to the ground voltage (VSS) level. At this time, the bit line select circuits 110, 130 of the page buffers PB1 to PB2K do not supply the bit line bias voltage (VIRPWR) to the bit lines BLe1 to BLe2K in response to the bit line control signals (DlCHe1, DlCHe2).

Thereafter, the bit line precharge signal (VBLe1) is enabled during a predetermined time (D11). At this time, the bit line precharge signal (VBLo1) keeps disabled. As a result, the bit line precharge circuits BLP1, BLP3, . . . , BLP(2K−1) precharge the bit lines BLe1, BLe3, . . . , BLe(2K−1) to the reference voltage (VREF) level in response to the bit line precharge signal (VBLe1). The reference voltage (VREF) is kept to a constant voltage (e.g., VCC) level regardless of variation in temperature and/or voltage.

Furthermore, the bit line precharge signal (VBLe2) is enabled during a predetermined time (D12) after predetermined time (H11) elapses since the bit line precharge signal (VBLe1) is enabled. As a result, the bit line precharge circuits BLP2, BLP4, . . . ,PLP2K precharge the bit lines BLe2, BLe4, . . . , BLe2K to the reference voltage (VREF) level in response to the bit line precharge signal (VBLe2).

The precharge control signal (PRCHb1) is disabled during a predetermined time (D13). As a result, the precharge circuits P41 of the page buffers PB1,PB3, . . . ,PB(2K−1) precharge the sensing nodes S1 to the voltage (VCC) level in response to the precharge control signal (PRCHb1).

Thereafter, the bit line select signal (BSLe1) is enabled during a predetermined time (D14). When the bit line select signal (BSLe1) is enabled, the latch control signal (LCH1) is enabled during a predetermined time (D15). As a result, the bit line select circuits 110 of the page buffers PB1, PB3, . . . ,PB(2K−1) connect the bit lines BLe1, BLe3, . . . , BLe(2K−1) to the sensing nodes S1 in response to the bit line select signal (BSLe1).

In this case, the bit lines BLe1, BLe3, . . . , BLe(2K−1) are precharged to a stable reference voltage (VREF) level regardless of variation in temperature and/or voltage. Therefore, a voltage of each of the sensing nodes S1 can become high level or low level accurately according to a value of the read data (RD1) of memory cells (not shown) connected to the bit lines BLe1, BLe3, . . . , BLe(2K−1). Therefore, each of the sensing circuits 121 of the page buffers PB1,PB3, . . . , PB(2K−1) erroneously operates, but senses a voltage of the sensing node S1 and generates the sensed data (SQ1b), in response to the latch control signal (LCH1).

Thereafter, each of the latch circuits 122 of the page buffers PB1,PB3, . . . ,PB(2K−1) latches the sensed data (SQ1b) and outputs the inverted sensed data (SQ1).

Meanwhile, when the precharge control signal (PRCHb1) is disabled and the bit line select signal (BSLe1) is enabled, the bit line select signal (BSLe2) keeps disabled and the precharge control signal (PRCHb2) keeps enabled. As a result, the bit line select circuits 130 of the page buffers PB2,PB4, . . . ,PB(2K) separate the bit lines BLe2, BLe4, . . . , BLe(2K) from the sensing nodes S2.

Furthermore, the precharge circuits P5 of the page buffers PB2,PB4, . . . ,PB(2K) stop the precharge operation of the sensing nodes S2 in response to the precharge control signal (PRCHb2). As a result, when each of the sensing circuits 121 senses the voltage of the sensing node S1, the sensing node S2 is not precharged but keeps floated. Therefore, coupling capacitance components between the sensing nodes S1, S2 can be reduced. As a result, since the voltage of the sensing node S2 does not influence the voltage of the sensing node S1, the sensing circuits 121 erroneously operate but can accurately sense the voltage of the sensing node S1.

Thereafter, the precharge control signal (PRCHb2) is disabled during a predetermined time (D16). The precharge circuits P51 of the page buffers PB2,PB4, . . . ,PB2K precharge the sensing nodes S2 to the voltage (VCC) level in response to the precharge control signal (PRCHb2). Furthermore, the bit line select signal (BSLe2) is enabled during a predetermined time (D17) after a predetermined time (H12) elapses since the bit line select signal (BSLe1) is enabled. When the bit line select signal (BSLe2) is enabled, the latch control signal (LCH2) is enable during a predetermined time (D18). As a result, the bit line select circuits 130 of the page buffers PB2,PB4, . . . ,PB2K connect the bit lines BLe2, BLe4, . . . , BLe2K to the sensing nodes S2 in response to the bit line select signal (BSLe2).

In this case, the bit lines BLe2, BLe4, . . . , BLe2K are precharged to a stable reference voltage (VREF) level regardless of variation in temperature and/or voltage. Therefore, a voltage of the sensing nodes S2 can become high level or low level accurately according to a voltage of the read data (RD2) of memory cells (not shown) connected to the bit lines BLe2, BLe4, . . . , BLe2K. Therefore, each of the sensing circuits 141 of the page buffers PB2,PB4, . . . , PB2K erroneously operates, but can sense a voltage of the sensing node S2 in response to the latch control signal (LCH2) and generate the sensed data (SQ2b).

Thereafter, each of the latch circuits 142 of the page buffers PB2,PB4, . . . ,PB2K latches the sensed data (SQ1b) and outputs the inverted sensed data (SQ2).

Meanwhile, when the precharge control signal (PRCHb2) is disabled and the bit line select signal (BSLe2) is enabled, the bit line select signal (BSLe1) keeps disabled and the precharge control signal (PRCHb1) keeps enabled. As a result, the bit line select circuits 110 of the page buffers PB1,PB3, . . . ,PB(2K-1) separate the bit lines BLe1, BLe3, . . . , BLe(2K-1) from the sensing nodes S1, respectively.

Furthermore, the precharge circuits P41 of the page buffers PB1,PB3, . . . ,PB(2K-1) stop the precharge operation of the sensing nodes S1 in response to the precharge control signal (PRCHb1). As a result, when each of the sensing circuits 141 senses a voltage of the sensing node S2, the sensing node S1 is not precharged but keeps floated. Therefore, coupling capacitance components between the sensing nodes S1, S2 can be reduced. As a result, since the voltage of the sensing node S1 does not influence the voltage of the sensing node S2, the sensing circuits 141 erroneously operate, but can sense the voltage of the sensing node S2 accurately.

Though not shown in FIG. 5, thereafter, if the I/O control signal (PBDO) is enabled, the pass circuits N46, N56 of the page buffers PB1 to PB2K output the inverted sensed data (SQ1, SQ2), which are received from the latch circuits 122, 142, to the Y-gates YG1 to YG2K of the Y-gate circuit 200 at the same time in response to the I/O control signal (PBDO). Thereafter, the gate control signals (YS1 to YS2K) are sequentially enabled one by one for a predetermined time and then disabled. That is, when one of the gate control signals (YS1 to YS2K) is enabled, the remaining gate control signals are disabled. Furthermore, YS1, YS2, YS3, . . . , YS 2K-1, YS2K can be consecutively enabled one by one in that order. As a result, the Y-gates YG1 to YG2K sequentially output the sensed data (SQ1, SQ2) to the data I/O lines DIOL, respectively.

As described above, a bit line precharge circuit supplies a stable precharge voltage to bit line regardless of variation in temperature and/or voltage in the read operation. Therefore, erroneous data can be prevented from being read and the reliability of a flash memory device can be improved.

Furthermore, in accordance with a read method of a flash memory device, since coupling capacitance components between neighboring sensing nodes can be reduced, erroneous data can be prevented from being read.

Although the foregoing description has been made with reference to various embodiments, it is to be understood that changes and modifications of the present invention may be made by the person of ordinary skilled in the art without departing from the spirit and scope of the present invention defined by the appended claims.

What is claimed as new and desired to be protected by Letters Patent of the United States is:

1. A page buffer circuit of a flash memory device including memory cells connected to a plurality of bit line pairs, comprising:
    page buffers which are connected to the plurality of bit line pairs, respectively, and execute a read operation or a program operation on memory cells in response to a bit line control signal, a bit line select signal and a control signal; and
    bit line precharge circuits, which are connected to the plurality of bit line pairs, respectively, and in the read operation, precharge one of a pair of bit lines connected thereto to a reference voltage level in response to a bit line precharge signal,
    wherein the reference voltage is a stable voltage regardless of variation in temperature and/or voltage.

2. The page buffer circuit as claimed in claim 1, further comprising a reference voltage generator that generates the reference voltage.

3. The page buffer circuit as claimed in claim 1, wherein each of the plurality of page buffers includes:
    a bit line select circuit that selects one of a pair of bit lines connected thereto, connects the selected bit line to a sensing node, separates the other of the pair of bit lines from the sensing node and supplies the other of the pair of bit lines with a ground voltage, in response to the bit line control signal and the bit line select signal in the read operation; and
    a register circuit that senses read data received from the selected bit line and stores the sensed data therein, in response to the control signal in the read operation,
    wherein each of the bit line precharge circuits precharges the selected bit line to the reference voltage level.

4. The page buffer circuit as claimed in claim 3, wherein the control signal includes a precharge control signal, a latch control signal, a program control signal, an I/O control signal and a reset control signal, and
    the register circuit includes:
    a precharge circuit that precharges the sensing node to a set voltage level in response to the precharge control signal;
    a sensing circuit that senses the read data and generates sensed data, in response to the latch control signal in the read operation;
    a latch circuit that latches the sensed data in the read operation and latches program data in the program operation;
    a first pass circuit, which is connected between the latch circuit and the sensing node and outputs the program data, which are received from the latch circuit, to the sensing node in response to the program control signal in the program operation;
    a second pass circuit that outputs inverted data of the sensed data, which are received from the latch circuit, to one of the Y-gates in response to the I/O control signal in the read operation, and outputs the program data, which are received from one of the Y-gates, to the latch circuit in response to the I/O control signal in the program operation; and a latch reset circuit that initializes the latch circuit in response to the reset control signal.

5. The page buffer circuit as claimed in claim 1, wherein each of the bit line precharge circuits includes:

a first switch, which is connected between one of a pair of bit lines corresponding thereto and the reference voltage and is turned on or off in response to an associated bit line precharge signal; and a second switch, which is connected between the other of the pair of bit lines and the reference voltage and is turned on or off in response to an associated bit line precharge signal.

6. A page buffer circuit of a flash memory device including first memory cells connected to first bit line pairs and second memory cells connected to second bit line pairs, the page buffer circuit comprising:

first page buffers, which are connected to the first bit line pairs, respectively, and execute a read operation or a program operation on the first memory cells at the same time in response to a first bit line control signal, a first bit line select signal and a first control signal;

second page buffers, which are connected to the second bit line pairs, respectively, and execute a read operation or a program operation on the second memory cells at the same time in response to a second bit line control signal, a second bit line select signal and a second control signal;

first bit line precharge circuits, which are connected to the first bit line pairs, respectively, and precharge one of a pair of first bit lines connected thereto to a reference voltage level at the same time in response to a first bit line precharge signal in the read operation of the first page buffers; and second bit line precharge circuits, which are connected to the second bit line pairs, respectively, and precharge one of a pair of second bit lines connected thereto to the reference voltage in response to a second bit line precharge signal in the read operation of the second page buffers, wherein the reference voltage is a stable voltage regardless of variation in temperature and/or voltage.

7. The page buffer circuit as claimed in claim 6, further comprising a reference voltage generator that generates the reference voltage.

8. The page buffer circuit as claimed in claim 6, wherein the first page buffers and the second page buffers are alternately disposed one by one.

9. The page buffer circuit as claimed in claim 6, wherein each of the first page buffers includes:

a bit line select circuit that selects one of a pair of the first bit lines connected thereto, connects the selected bit line to a sensing node, separates the other of the pair of first bit lines from the sensing node, and supplies the other of the pair of first bit lines with a ground voltage, in response to the first bit line control signal and the first bit line select signal in the read operation; and a register circuit that senses read data received from the selected bit line and stores the sensed data therein in response to the first control signal in the read operation, wherein each of the first bit line precharge circuits precharges the selected bit line to the reference voltage level.

10. The page buffer circuit as claimed in claim 6, wherein each of the second page buffers includes:

a bit line select circuit that selects one of a pair of the second bit lines connected thereto, connects the selected bit line to a sensing node, separates the other of the pair of second bit lines from the sensing node and supplies the other of the pair of second bit lines with a ground voltage, in response to the second bit line control signal and the second bit line select signal in the read operation; and a register circuit that senses read data received from the selected bit line and stores the sensed data therein, in response to the second control signal in the read operation, wherein each of the second bit line precharge circuits precharges the selected bit line to the reference voltage level.

11. The page buffer circuit as claimed in claim 6, wherein each of the first bit line precharge circuits includes:

a first switch, which is connected between one of a pair of first bit lines corresponding thereto and the reference voltage and is turned on or off in response to an associated first bit line precharge signal; and a second switch, which is connected between the other of the pair of first bit lines and the reference voltage and is turned on or off in response to an associated first bit line precharge signal.

12. The page buffer circuit as claimed in claim 6, wherein each of the second bit line precharge circuits includes:

a first switch, which is connected between one of a pair of second bit lines corresponding thereto and the reference voltage and is turned on or off in response to an associated second bit line precharge signal; and a second switch, which is connected between the other of the pair of second bit lines and the reference voltage and is turned on or off in response to an associated second bit line precharge signals.

13. A method of controlling a read operation of a page buffer circuit, comprising:

allowing a precharge circuit of each of a plurality page buffers, each connected to a pair of bit lines, to precharge a sensing node to a set voltage in response to a precharge control signal;

allowing each of a plurality bit line precharge circuits, each connected to a pair of bit lines, to precharge one of the pair of bit lines to a reference voltage level in response to a bit line precharge signal;

allowing a bit line select circuit of each of the page buffers to select one of the pair of bit lines and to connect the selected bit line to the sensing node, in response to a bit line control signal and a bit line select signal; and allowing a register circuit of each of the page buffers to sense a voltage of the sensing node, store the sensed data therein and output the stored data as read data, in response to a latch control signal, wherein a bit line precharged to the reference voltage level is the selected bit line and the reference voltage is a stable voltage regardless of variation in temperature and/or voltage.

14. A method of controlling a read operation of a page buffer circuit, comprising:

allowing a first precharge circuit of each of first page buffers, each connected to a pair of first bit lines, to precharge a first sensing node to a set voltage in response to a first precharge control signal;

allowing a second precharge circuit of each of second page buffers, each connected to a pair of second bit lines, to precharge a second sensing node to a set voltage in response to a second precharge control signal;

allowing each of first bit line precharge circuits, each connected to the pair of first bit lines, to precharge one of the pair of first bit lines to a reference voltage level in response to a first bit line precharge signal; allowing each of second bit line precharge circuits, each connected to the pair of second bit lines, to precharge one of the pair of second bit lines to a reference voltage level in response to a second bit line precharge signal;

allowing a first bit line select circuit of each of the first page buffers to select one of the pair of first bit lines and to connect the selected first bit line to the first sensing node, in response to a first bit line control signal and a first bit line select signal;

allowing a second bit line select circuit of each of the second page buffers to select one of the pair of second bit lines and to connect the selected second bit line to the second sensing node, in response to a second bit line control signal and a second bit line select signal;

allowing a first register circuit of each of the first page buffers to sense a voltage of the first sensing node, store first sensed data therein and output the stored data as first read data, in response to a first latch control signal; and allowing a second register circuit of each of the second page buffers to sense a voltage of the second sensing node, store second sensed data therein and output the stored data as second read data, in response to a second latch control signal, wherein the first or second bit line that is precharged to the reference voltage level is the selected first or second bit line, and the reference voltage is a stable voltage regardless of variation in temperature and/or voltage.

15. A method of controlling a read operation of a page buffer circuit, comprising:

allowing a first bit line precharge circuit of each of first page buffers, each connected to a pair of first bit lines, to precharge one of the pair of first bit lines to a reference voltage level in response to first bit line precharge signals;

allowing a second bit line precharge circuit of each of second page buffers, each connected to a pair of second bit lines, to precharge one of the pair of second bit lines to a reference voltage level in response to second bit line precharge signals;

allowing a first precharge circuit of each of the first page buffers to precharge a first sensing node to a set voltage in response to a first precharge control signal;

allowing a first bit line select circuit of each of the first page buffers to select one of the pair of first bit lines and to connect the selected first bit line to the first sensing node, in response to first bit line control signals and first bit line select signals;

allowing a first register circuit of each of the first page buffers to sense a voltage of the first sensing node, stores first sensed data therein and output the stored data as first read data, in response to a first latch control signal, when the selected first bit line is connected to the first sensing node;

allowing a second precharge circuit of each of the second page buffers to precharge a second sensing node to a set voltage in response to a second precharge control signal;

allowing a second bit line select circuit of each of the second page buffers to select one of the pair of second bit lines and to connect the selected second bit line to the second sensing node, in response to second bit line control signals and second bit line select signals; and allowing a second register circuit of each of the second page buffers to sense a voltage of the second sensing node, stores second sensed data therein and output the stored data as second read data, in response to a second latch control signal, when the selected second bit line is connected to the second sensing node, wherein the first page buffers and the second page buffers are alternately disposed one by one, and when the first bit line select circuit connects the selected first bit line to the first sensing node, the second bit line select circuit separates the selected second bit line from the second sensing node.

16. The method as claimed in claim 15, wherein the reference voltage is a stable voltage regardless of variation in temperature and/or voltage, and each of the first bit line precharge circuits precharges the selected first bit line to the reference voltage level, and each of the second bit line precharge circuits precharges the selected second bit line to the reference voltage level.

17. The method as claimed in claim 15, wherein the first precharge circuit precharges the first sensing node to the set voltage during a set time before the first bit line select circuit connects the selected first bit line to the first sensing node, the second precharge circuit precharges the first sensing node to the set voltage during the set time before the second bit line select circuit connects the selected second bit line to the second sensing node, and when the first precharge circuit precharges the first sensing node and the first bit line select circuit connects the selected first bit line to the first sensing node, the second precharge circuit stops the precharge operation of the second sensing node.

* * * * *